US012588462B2

(12) United States Patent
Huang

(10) Patent No.: US 12,588,462 B2
(45) Date of Patent: Mar. 24, 2026

(54) SEMICONDUCTOR STRUCTURE AND FABRICATION METHOD THEREOF

(71) Applicant: United Semiconductor (Xiamen) Co., Ltd., Xiamen (CN)

(72) Inventor: Ji He Huang, Suzhou City (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 742 days.

(21) Appl. No.: 17/953,285

(22) Filed: Sep. 26, 2022

(65) Prior Publication Data

US 2024/0079255 A1      Mar. 7, 2024

(30) Foreign Application Priority Data

Sep. 5, 2022    (CN) .......................... 202211076632.7

(51) Int. Cl.
| | | |
|---|---|---|
| *H01L 21/67* | (2006.01) |
| *H01L 21/02* | (2006.01) |
| *H01L 21/768* | (2006.01) |
| *H01L 23/522* | (2006.01) |
| *H01L 23/528* | (2006.01) |
| *H01L 23/532* | (2006.01) |

(52) U.S. Cl.
CPC .. *H01L 21/67288* (2013.01); *H01L 21/02274* (2013.01); *H01L 21/76831* (2013.01); *H01L 21/76879* (2013.01); *H01L 23/5226* (2013.01); *H01L 23/5286* (2013.01); *H01L 23/53223* (2013.01); *H01L 23/53238* (2013.01)

(58) Field of Classification Search
CPC ......... H01L 21/67288; H01L 21/76831; H01L 21/76879; H01L 23/5226; H01L 21/76843; H01L 21/02126; H01L 21/02282
See application file for complete search history.

(56) References Cited

U.S. PATENT DOCUMENTS

| | | | | |
|---|---|---|---|---|
| 5,849,640 A * | 12/1998 | Hsia | ................... | H01L 21/31055 |
| | | | | 438/711 |
| 5,898,221 A * | 4/1999 | Mizuhara | .......... | H01L 23/53223 |
| | | | | 257/E21.582 |
| 5,989,983 A * | 11/1999 | Goo | ..................... | H01L 21/0234 |
| | | | | 438/782 |
| 6,001,745 A * | 12/1999 | Tu | ..................... | H01L 21/76802 |
| | | | | 438/782 |
| 6,117,785 A * | 9/2000 | Lee | ................... | H01L 21/76804 |
| | | | | 438/782 |
| 6,265,298 B1 * | 7/2001 | Chen | ................. | H01L 21/76819 |
| | | | | 438/626 |
| 6,551,867 B1 * | 4/2003 | Ozeki | .................... | H10B 69/00 |
| | | | | 438/165 |
| 6,656,778 B1 | 12/2003 | Chen | | |

(Continued)

FOREIGN PATENT DOCUMENTS

KR          100583619          5/2006

*Primary Examiner* — Bac H Au

(74) *Attorney, Agent, or Firm* — Winston Hsu

(57)          ABSTRACT

A semiconductor structure includes a substrate; a top metal layer disposed in a top inter-metal dielectric (IMD) layer on the substrate; a first passivation layer covering the top metal layer and the top IMD layer; a pad layer disposed on the first passivation layer and electrically connected to the top metal layer; a spin-on glass (SOG) layer covering the pad layer and the first passivation layer; and a second passivation layer disposed on the SOG layer.

10 Claims, 3 Drawing Sheets

(56) References Cited

U.S. PATENT DOCUMENTS

| | | | | |
|---|---|---|---|---|
| 7,670,961 | B2 * | 3/2010 | Sachdev | ........... H01L 21/02134 |
| | | | | 438/782 |
| 8,643,151 | B2 * | 2/2014 | Liu | ..................... H01L 23/3192 |
| | | | | 257/E23.126 |
| 2003/0119301 | A1 * | 6/2003 | Hsue | ................. H01L 21/76837 |
| | | | | 438/620 |
| 2003/0148631 | A1 * | 8/2003 | Kuo | ................. H01L 21/31116 |
| | | | | 438/782 |
| 2013/0009288 | A1 * | 1/2013 | Hu | ................... H01L 21/76801 |
| | | | | 438/597 |

* cited by examiner

SEMICONDUCTOR STRUCTURE AND FABRICATION METHOD THEREOF

BACKGROUND OF THE INVENTION

1. Field of the Invention

The present invention relates to the field of semiconductor technology, in particular to the field of semiconductor back-end-of-the-line (BEOL) technology.

2. Description of the Prior Art

In conventional semiconductor back-end-of-the-line (BEOL) process, after the aluminum pad layer is formed, a plasma-enhanced chemical vapor deposition (PECVD) process is performed to conformally deposit passivation layers, for example, a phosphorous silicate glass (PSG) layer and a silicon nitride layer, on the surface of the aluminum pad layer in a high temperature (over 400 degrees Celsius) environment after.

However, the difference in thermal expansion coefficient between the passivation layer and the aluminum pad layer may lead to a cracking problem of the passivation layer.

SUMMARY OF THE INVENTION

It is one object of the present invention to provide an improved semiconductor structure and fabrication method to solve the above-mentioned deficiencies or shortcomings of the prior art.

One aspect of the invention provides a semiconductor structure including a substrate; a top metal layer disposed in a top inter-metal dielectric (IMD) layer on the substrate; a first passivation layer covering the top metal layer and the top IMD layer; a pad layer disposed on the first passivation layer and electrically connected to the top metal layer; a spin-on glass (SOG) layer covering the pad layer and the first passivation layer; and a second passivation layer disposed on the SOG layer.

According to some embodiments, the pad layer is an aluminum pad layer.

According to some embodiments, the top metal layer is a copper layer.

According to some embodiments, the SOG layer has a flat top surface.

According to some embodiments, a partial top surface of the SOG layer is higher than a top surface of the pad layer.

According to some embodiments, the SOG layer is in direct contact with sidewalls and the top surface of the pad layer.

According to some embodiments, the first passivation layer is a silicon oxide layer.

According to some embodiments, the second passivation layer is a silicon nitride layer.

According to some embodiments, the second passivation layer is in direct contact with the SOG layer.

According to some embodiments, the semiconductor structure further includes a via plug in the first passivation layer to electrically connect the pad layer with the top metal layer; and a liner layer between the via plug and the first passivation layer.

Another aspect of the invention provides a method for fabricating a semiconductor structure. A substrate is provided. A top metal layer is formed in a top inter-metal dielectric (IMD) layer on the substrate. A first passivation layer covering the top metal layer and the top IMD layer is formed. A pad layer is formed on the first passivation layer. The pad layer is electrically connected to the top metal layer. A spin-on glass (SOG) layer is formed to cover the pad layer and the first passivation layer at a temperature lower than 400 degrees Celsius. A second passivation layer is formed on the SOG layer.

According to some embodiments, the pad layer is an aluminum pad layer.

According to some embodiments, the top metal layer is a copper layer.

According to some embodiments, the SOG layer has a flat top surface.

According to some embodiments, a partial top surface of the SOG layer is higher than a top surface of the pad layer.

According to some embodiments, the SOG layer is in direct contact with sidewalls and the top surface of the pad layer.

According to some embodiments, the first passivation layer is a silicon oxide layer.

According to some embodiments, the second passivation layer is a silicon nitride layer.

According to some embodiments, the second passivation layer is in direct contact with the SOG layer.

According to some embodiments, the method further includes the steps of forming a via plug in the first passivation layer to electrically connect the pad layer with the top metal layer; and forming a liner layer between the via plug and the first passivation layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
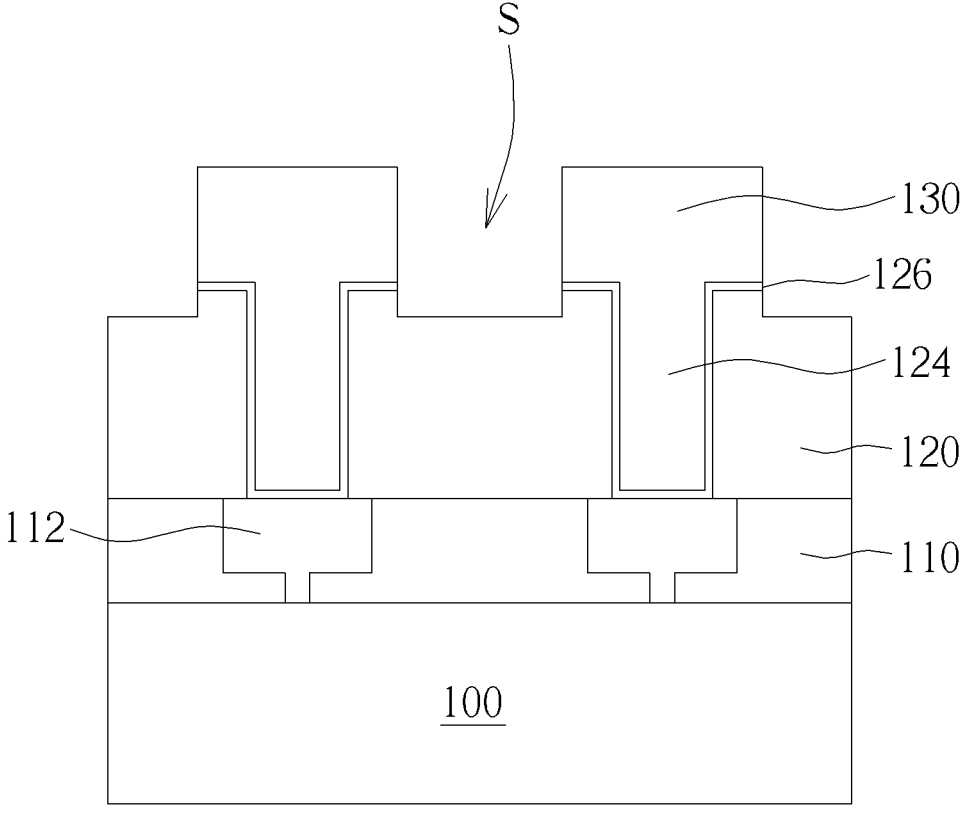
FIG. 1 to FIG. 3 are schematic diagrams illustrating a method for fabricating a semiconductor structure according to an embodiment of the present invention.
Figure 2:
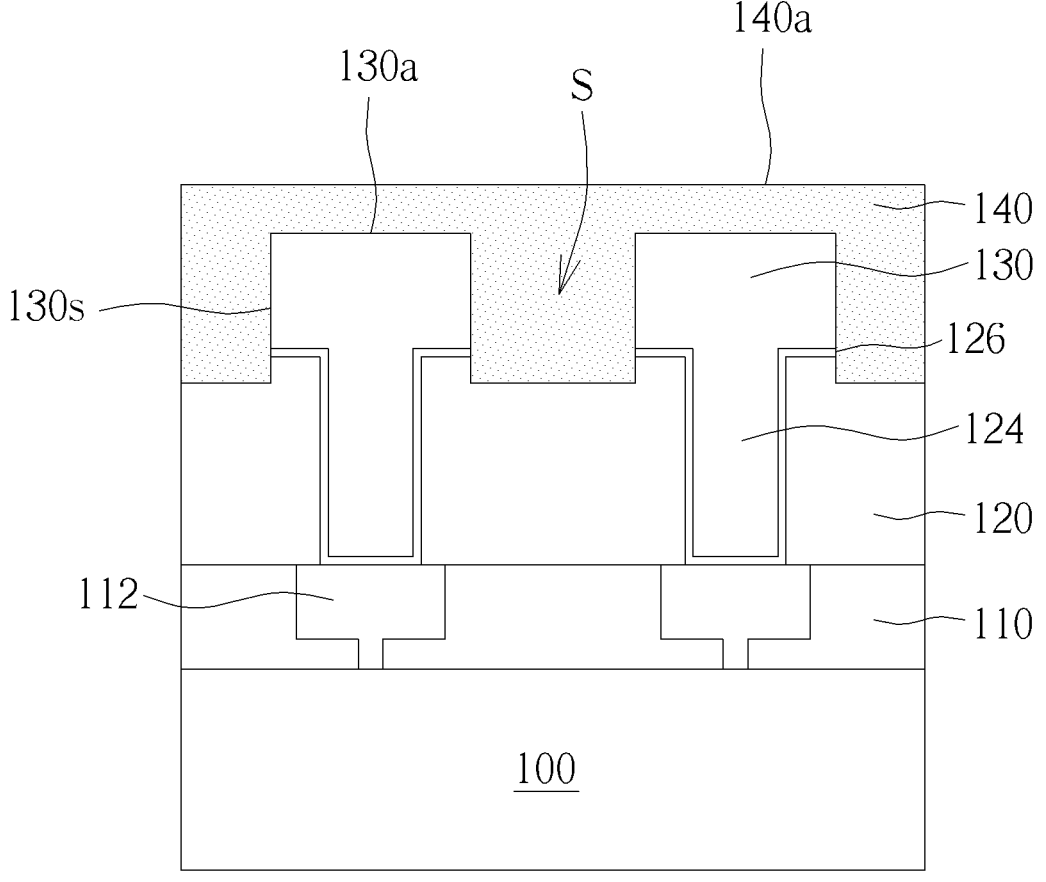
Figure 3:
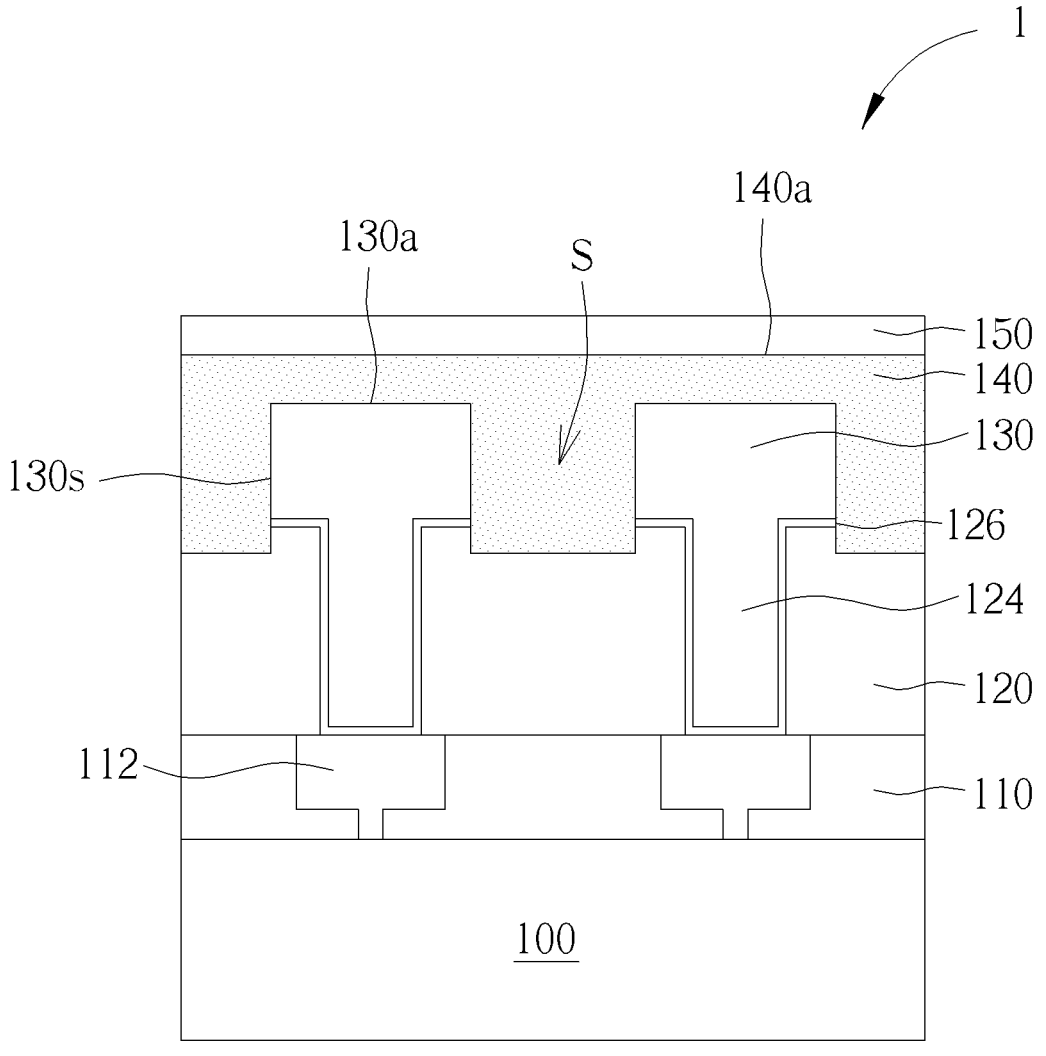

Please refer to FIG. 1 to FIG. 3, which are schematic diagrams of a method for fabricating a semiconductor structure according to an embodiment of the present invention. As shown in FIG. 1, first, a substrate 100, for example, a semiconductor substrate is provided. A top metal layer 112 is formed in a top inter-metal dielectric (IMD) layer 110 on the substrate 100. According to an embodiment of the present invention, the top IMD layer 110 may include an ultra-low dielectric constant (ULK) material layer. According to an embodiment of the present invention, the top metal layer 112 may be a copper layer, for example, a damascene copper layer formed by using a copper damascene process.

Subsequently, a first passivation layer 120 is formed to cover the top metal layer 112 and the top IMD layer 110. According to an embodiment of the present invention, the first passivation layer 120 may be a silicon oxide layer. Next, a pad layer 130 is formed on the first passivation layer 120. According to an embodiment of the present invention, the pad layer 130 may be an aluminum pad layer. According to an embodiment of the present invention, the pad layer 130 is electrically connected to the top metal layer 112 through a via plug 124 formed in the first passivation layer 120.

According to an embodiment of the present invention, the via plug 124 may be an aluminum via plug. According to an embodiment of the present invention, a liner layer 126 may be further formed between the via plug 124 and the first passivation layer 120. According to embodiments of the present invention, the liner layer 126 may comprise tantalum or tantalum nitride, for example. According to the embodiment of the present invention, at this point, a recessed region S is formed between the pad layers 130.

According to an embodiment of the present invention, next, as shown in FIG. 2, a spin-on glass (SOG) layer 140 covering the pad layer 130 and the first passivation layer 120 is formed. For example, a spin coating solution composed of silicon and oxy-organic compound ($Si_xO_yC_zH_wF_v$) is used to coat the pad layer 130 and the first passivation layer 120 by spin coating, and then the coated layer is baked at a low temperature, for example, at a temperature of 150 degrees Celsius to 400 degrees Celsius, for example, 150 degrees Celsius to 200 degrees Celsius. The spin-coating solution is coated on the pad layer 130 and the first passivation layer 120 to form the spin-coated glass layer 140 at a low temperature.

According to an embodiment of the present invention, the SOG layer 140 fills the recessed region S, and thus has a flat top surface 140a. According to an embodiment of the present invention, a partial top surface 140a of the SOG layer 140 is higher than the top surface 130a of the pad layer 130. According to an embodiment of the present invention, the SOG layer 140 is in direct contact with the sidewall 130s and the top surface 130a of the pad layer 130.

According to an embodiment of the present invention, next, as shown in FIG. 3, a second passivation layer 150 is formed on the SOG layer 140. According to an embodiment of the present invention, the second passivation layer 150 may be a silicon nitride layer. According to an embodiment of the present invention, the second passivation layer 150 is in direct contact with the SOG layer 140. According to an embodiment of the present invention, the second passivation layer 150 may be formed using a PECVD process.

One advantage of the present invention is that the SOG layer 140 covering the pad layer 130 and the first passivation layer 120 is formed by spin-coating and low-temperature baking, which can improve the influence of the thermal expansion effect and obtain a good step coverage, thereby strengthening the regions with weaker strength between the pad layers 130. The second passivation layer 150 with higher hardness is then deposited as a protective layer. The present invention can effectively solve the problem of cracking of the passivation layer.

Structurally, as shown in FIG. 3, the semiconductor structure 1 includes: a substrate 100; a top metal layer 112 disposed in the top IMD layer 110 on the substrate 100; a first passivation layer 120 covering the top metal layer 112 and the top IMD layer 110; a pad layer 130 disposed on the first passivation layer 120 and electrically connected to the top metal layer 112; a spin-on glass (SOG) layer 140 covering the pad layer 130 and the first passivation layer 120; and a second passivation layer 150 disposed on the SOG layer 140.

According to an embodiment of the present invention, the pad layer 130 is an aluminum pad layer.

According to an embodiment of the present invention, the top metal layer 112 is a copper layer.

According to an embodiment of the present invention, the SOG layer 140 has a flat top surface 140a.

According to an embodiment of the present invention, a partial top surface 140a of the SOG layer 140 is higher than the top surface 130a of the pad layer 130.

According to the embodiment of the present invention, the SOG layer 140 is in direct contact with the sidewall 130s and the top surface 130a of the pad layer 130.

According to an embodiment of the present invention, the first passivation layer 120 is a silicon oxide layer.

According to an embodiment of the present invention, the second passivation layer 150 is a silicon nitride layer.

According to the embodiment of the present invention, the second passivation layer 150 is in direct contact with the SOG layer 140.

According to an embodiment of the present invention, the semiconductor structure 1 further includes: a via plug 124 located in the first passivation layer 120 for electrically connecting the pad layer 130 with the top metal layer 112; and a liner layer 126 located between the via plug 124 and the first passivation layer 120.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate;
at least two top metal layers disposed in a top inter-metal dielectric (IMD) layer on the substrate;
a first passivation layer covering the at least two top metal layers and the top IMD layer;
at least two pad layers disposed on the first passivation layer and electrically connected to the at least two top metal layers, respectively;
a recessed region disposed between the at least two pad layers and extended into the first passivation layer;
a spin-on glass (SOG) layer covering the pad layer and the first passivation layer and filled into the recessed region; and
a second passivation layer disposed on the SOG layer, wherein the SOG layer is in direct contact with the at least two pad layers.

2. The semiconductor structure according to claim 1, wherein the at least two pad layers are aluminum pad layers.

3. The semiconductor structure according to claim 1, wherein the at least two top metal layers are copper layers.

4. The semiconductor structure according to claim 1, wherein the SOG layer has a flat top surface.

5. The semiconductor structure according to claim 1, wherein a partial top surface of the SOG layer is higher than a top surface of the at least two pad layers.

6. The semiconductor structure according to claim 5, wherein the SOG layer is in direct contact with sidewalls and the top surface of the at least two pad layers.

7. The semiconductor structure according to claim 1, wherein the first passivation layer is a silicon oxide layer.

8. The semiconductor structure according to claim 1, wherein the second passivation layer is a silicon nitride layer.

9. The semiconductor structure according to claim 1, wherein the second passivation layer is in direct contact with the SOG layer.

10. The semiconductor structure according to claim 1 further comprising:

via plugs in the first passivation layer to electrically connect the at least two pad layers with the at least two top metal layers, respectively; and a liner layer between the via plugs and the first passivation layer.

* * * * *